United States Patent
Furushima

[11] Patent Number: 5,815,520
[45] Date of Patent: Sep. 29, 1998

[54] LIGHT EMITTING SEMICONDUCTOR DEVICE AND ITS MANUFACTURING METHOD

[75] Inventor: Yuji Furushima, Tokyo, Japan

[73] Assignee: NEC Corporation, Japan

[21] Appl. No.: 670,717

[22] Filed: Jun. 21, 1996

[30] Foreign Application Priority Data

Jul. 27, 1995 [JP] Japan .................................. 7-192075

[51] Int. Cl.[6] .............................. H01L 33/00; H01S 3/19; H01S 3/18
[52] U.S. Cl. ................... 372/45; 372/43; 257/94; 257/96
[58] Field of Search .................... 257/94, 96, 97, 257/103; 372/45, 43, 44, 46

[56] References Cited

U.S. PATENT DOCUMENTS 5,602,418  2/1997  Imai et al. ............................ 257/96
5,604,763  2/1997  Kato et al. ............................ 372/45

FOREIGN PATENT DOCUMENTS

| 2-229476 | 9/1990 | Japan | H01L 33/00 |
| 4-209577 | 7/1992 | Japan | H01L 33/00 |
| 4-236478 | 8/1992 | Japan | H01S 3/18 |
| 4-297023 | 10/1992 | Japan | H01L 21/205 |
| 5-283744 | 10/1993 | Japan | H01L 33/00 |

*Primary Examiner*—Rodney B. Bovernick
*Assistant Examiner*—Luong-Quyen T. Phan
*Attorney, Agent, or Firm*—Hayes, Soloway, Hennessey, Grossman & Hage, P.C.

[57] ABSTRACT

The present invention discloses a highly bright short wavelength light emitting semiconductor device with high reliance having improved crystallinity and surface smoothness. The device comprises at least one layer of $In_xGa_yAl_{1-x-y}N$ (where, $0 \leq x \leq 1$, $0 \leq x+y \leq 1$) formed on a sapphire substrate or a Si substrate, wherein a ZnO buffer layer (2) which can lattice match $In_xGa_yAl_{1-x-y}N$ is formed on the substrate (1) and a manufacturing method thereof.

9 Claims, 1 Drawing Sheet

LIGHT EMITTING SEMICONDUCTOR DEVICE AND ITS MANUFACTURING METHOD

BACKGROUND OF THE INVENTION

1. Field of the Invention

This invention relates to a light emitting semiconductor device which can be used as a light source suitable for optical measurement instruments, optical information storage memories and optical information processors. This invention also relates to a manufacturing method of such a light emitting semiconductor device.

2. Description of the Related Art

A Group III nitride semiconductor expressed by a general formula $In_xGa_yAl_{1-x-y}N$ (where $0 \leq x \leq 1$, $0 \leq x+y \leq 1$, and hereafter referred to as InGaAlN) is attracting much attention as a blue and greenish-blue light emitting semiconductor device material. Since large, bulk single crystals of Group III nitride semiconductors such as InN, GaN, AlN, InGaAlN cannot be made, a conventional epitaxial growth method has been using sapphire ($\alpha$-$Al_2O_3$) as a substrate.

However, the interface energy caused by a large lattice mismatch, which amounts to 11–23%, and the difference in chemical properties between sapphire and InGaAlN causes a remarkable three dimensional crystal growth when InGaAlN crystals are formed directly on a sapphire substrate. Further, the electrical and optical properties cannot be improved due to the difficulty in obtaining a flat crystal surface and improving crystallinity. As a result, a light emitting InGaAlN semiconductor device formed on a sapphire substrate cannot provide enough emitting efficiency and a long device life, and therefore, it was not fit to be used as a light source in an optical measurement instrument, an optical information storage memory nor an optical information processor.

One resolution in the prior art to solve the above-mention drawbacks, Japanese Patent Application Laid-Open (Kokai) No. 2-229476, discloses a method of forming an AlN buffer layer on a sapphire substrate, and the Japanese Patent Application Laid-Open (Kokai) No. 4-297023 discloses a method of forming a $Ga_xAl_{1-x}N$ ($0<x \leq 1$) buffer layer at a low growth temperature.

However, the mismatch dislocation caused by the lattice mismatch at the interface of a substrate and a buffer layer cannot be reduced sufficiently, since these buffer layers do not perfectly lattice match with that of the sapphire substrate. Hence, the improvement of crystallinity, emitting efficiency and device lifetime of the InGaAlN light emitting device was difficult.

On the other hand, Japanese Patent Application Laid-Open (Kokai) Nos. 4-209577 and 4-236478 disclose a method of using a single crystal substrate of oxides, such as ZnO, MnO, $MgAl_2O_4$, MgO and CaO. On these substrates, a lattice matched epitaxial crystal growth is possible by selecting the composition of InGaAlN. Also, the Japanese Patent Application Laid-Open (Kokai) No. 5-283744 proposes a method of introducing a homo-epitaxially grown ZnO buffer layer on a ZnO single crystal substrate.

However, it is difficult to obtain a large bulk single crystal of ZnO, MnO, $MgAl_2O_4$, MgO, CaO, etc. and therefore these substrates are not adequate for the commercial production of InGaAlN light emitting devices on a large scale. Furthermore, the solubility of these oxide substrates in acidic or basic material is high such that the chemical stability of oxide substrates is cost prohibitive for mass production of a highly reliable light emitting semiconductor device.

BRIEF SUMMARY OF THE INVENTION

Accordingly, an object of the present invention is to resolve the above problems and to provide a light emitting semiconductor device having a high emitting efficiency and long device lifetime by improving the crystallinity of InGaAlN grown on sapphire substrates, which can be economically obtained in a form of relatively large sized bulk crystals, or on Si substrates. Another object of the present invention is to provide a manufacturing method thereof.

The present invention is intended to provide a light emitting semiconductor device comprising at least one layer of $In_xGa_yAl_{1-x-y}N$ (where, $0 \leq x \leq 1$, $0 \leq x+y \leq 1$) formed on either a sapphire substrate or a silicon substrate, such in that a ZnO buffer layer is formed directly on, and in touch with, a sapphire substrate or an Si substrate. Preferably, a ZnO buffer layer is a thin single crystal layer epitaxially grown on a sapphire substrate or an Si substrate. Alternatively, the ZnO buffer layer can be a thin single crystal layer containing some polycrystals, provided that the etch pit density caused by the crystal defects are less than $1 \times 10^8/cm^2$ at the etching of the crystal surface.

The detailed mechanism of the improvement of the crystallinity of the InGaAlN epitaxial film by the introduction of a ZnO buffer layer is explained as follows. The crystal structure of InGaAlN is a wurtzite structure belonging to the hexagonal system. On the other hand, that of sapphire ($\alpha$-$Al_2O_3$), a substrate conventionally used for the crystal growth of InGaAlN, is a corundum structure belonging to the trigonal system.

FIG. 1 shows bandgap and lattice constant data taking the lattice constant in the abscissa and the bandgap in the ordinate for GaN, AlN, and InN. Following Vegard's Law, the lattice constant and the bandgap in the triangular area surrounded by the solid lines in the figure can be realized by mixing the three binary semiconductors: GaN, AlN and InN, in an appropriate ratio.

The dotted line $L_1$ in the figure shows a line corresponding to the lattice constant of 2.75 A of sapphire, whose lattice mismatch with InGaAlN amounts to 11–23%.

Thus, it is very difficult to grow a good epitaxial layer on a sapphire substrate due to the extreme difference in crystal structure and the lattice constant. In case where an (111) Si having a diamond-like hexagonal structure is used as a substrate for the growth of an InGaAlN crystal, the lattice distance in the two dimensional lattice on the (111) facet of Si is 3.84 A and the lattice mismatch with InGaAlN amounts to 9–25%, which, together with the big difference in the crystal structure between the two, makes it very difficult to form a good epitaxial InGaAlN layer on Si.

On the contrary, the crystal structure of a ZnO buffer layer according to the present invention is a wurtzite structure just like InGaAlN. Furthermore, since the lattice constant is 3.25 A, lattice matching with InGaAlN becomes possible by the selection of an appropriate mixing ratio as indicated by line $L_2$ in FIG. 1. For the above reason, it is relatively easy to make an InGaAlN epitaxial film having good crystallinity on ZnO.

Furthermore, ZnO has a feature that a growth of an epitaxial single crystal film having remarkably high crystallinity is possible on a sapphire substrate or an Si substrate at a relatively low temperature of 300° C.–700° C. Also, growth of a C-axis oriented polycrystal film having high crystallinity can be formed on an Si oxide film, formed on an Si substrate or on an amorphous material such as a glass substrate.

Compared with AlN and GaAlN which have conventionally been used as a buffer layer, ZnO which is used as a buffer layer in the present invention is far superior in terms of the ease of epitaxial growth on a sapphire or Si substrate and the crystalline quality of the InGaAlN film obtained thereon.

This is supported by the fact that ZnO films, formed on various substrates, are commercially used as a low-loss surface acoustic wave filters, due to its excellent crystallinity, electrical properties and surface smoothness. Because of its excellent optical property, research aimed at the development of optical functional waveguide devices utilizing its acousto-optical effect, electro-optical effect and non-linear optical effect is currently being conducted.

Single crystal thin films of ZnO or such C-axis oriented films formed on a substrate of various kinds possesses high quality crystallinity comparable with a bulk single crystal. They can be formed on an inexpensive large sized substrate with a smooth surface. Therefore, epitaxial growth of lattice matched InGaAlN with high crystallinity becomes possible without using single crystal substrates of ZnO, MnO, $MgAl_2O_4$, MgO and CaO, a large bulk single crystal which are not easily obtained in spite of the small lattice mismatch with InGaAlN.

According to the present invention, by the introduction of a ZnO buffer layer which can lattice match with $In_xGa_yAl_{1-x-y}N$ (where, $0 \leq x \leq 1$, $0 \leq x+y \leq 1$), a large scale economical production of a bright short wavelength light emitting device having high efficiency and long life becomes possible due to reduced mismatch dislocations.

It will be appreciated by those skilled in the art that although the following Detailed Description will proceed with reference being made to preferred embodiments and methods of use, the present invention is not intended to be limited to these preferred embodiments and methods of use. Rather, the present invention is of broad scope and is intended to be limited as only set forth in the accompanying claims.

Other features and advantages of the present invention will become apparent as the following Detailed Description proceeds, and upon reference to the Drawings, wherein like numerals depict like parts, and wherein:

DETAILED DESCRIPTION OF THE PREFERRED EMBODIMENTS

Figure 1:
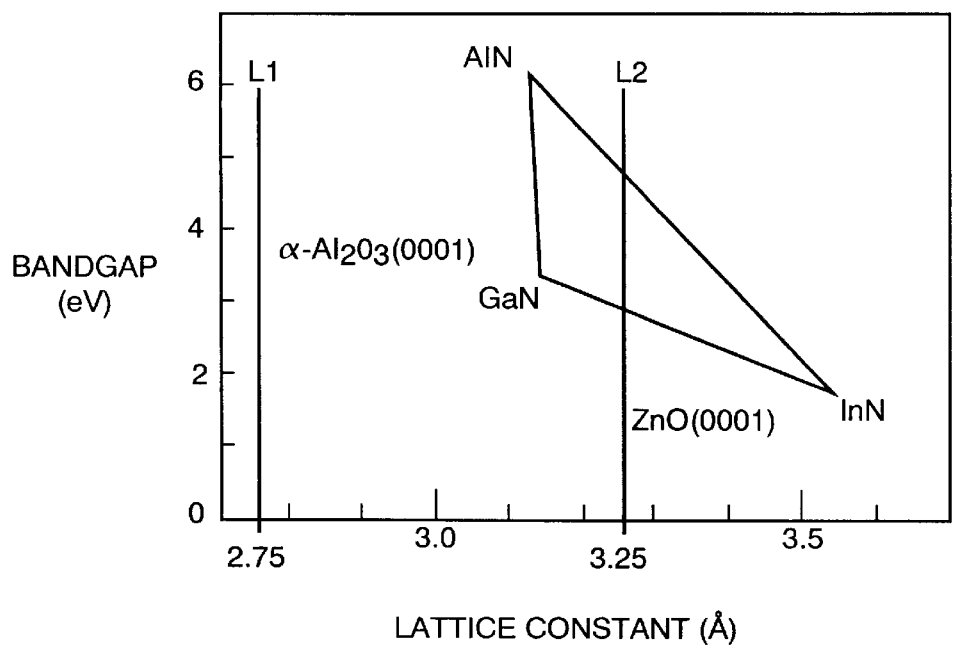
FIG. 1 shows a bandgap vs. lattice constant plot of Group III nitride compound semiconductors and their alloy crystals.
Figure 2:
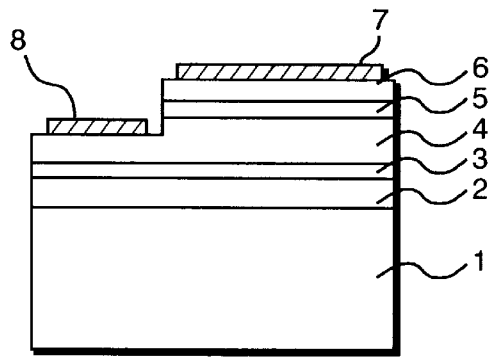
FIG. 2 shows a cross-sectional view of a double heterostructure semiconductor light emitting device according to the first embodiment of the present invention.

FIG. 2 shows a cross section of a light emitting device according to an embodiment of the present invention. The light emitting device comprises a ZnO (0001) epitaxial single crystal film buffer layer 2 with a film thickness of about 500 Å formed on a main surface of a sapphire (0001) substrate, an $In_{0.24}Ga_{0.55}Al_{0.21}N$ buffer layer 3 with a film thickness of 200 Å grown at a low temperature, an n-type low resistance $In_{0.24}Ga_{0.55}Al_{0.21}N$ cladding layer 4 doped with Si having a film thickness of 5 $\mu$m, an undoped $In_{0.2}Ga_{0.78}Al_{0.02}N$ active layer 5 with a thickness of 0.5 $\mu$m, a p-type $In_{0.24}Ga_{0.55}Al_{0.21}N$ cladding layer 6 doped with Mg with a film thickness of 2 $\mu$m, an ohmic electrode 7 on the p-type cladding layer 6, and an ohmic electrode 8 on the n-type cladding layer 4.

The compositions of the InGaAlN buffer layer 3, the n-type cladding layer 4, the active layer 5, and the p-type cladding layer 6 are selected so that they are lattice matched with ZnO, and that the bandgap energy of the InGaAlN buffer layer 3 and the cladding layers 4 and 6 is 0.3 eV larger than that of the active layer 5. Namely, the energy bandgap of the $In_{0.2}Ga_{0.78}Al_{0.02}N$ active layer 5 is about 3.13 eV and that of the $In_{0.24}Ga_{0.55}Al_{0.21}N$ layers is about 3.60 eV.

As a result, the refractive index of the active layer 5 becomes larger by about 10% than that of the buffer layer 3 and the cladding layers 4 and 5, which makes it possible to confine carriers and photons effectively in the active layer 5. When positive and negative voltages are applied on the electrodes 7 and 8, respectively, the active layer emits light of 440 nm wavelength with an external quantum efficiency of 2.7%.

Next, a method of crystal growth of the above device will be explained with reference to the well known metal organic vapor phase epitaxy (hereafter referred to as MOCVD method). First, a wet-cleaned sapphire substrate 1 is placed on the susceptor in the reaction vessel and the native oxides on the substrate are removed by heating the susceptor up to a temperature of 1000° C. or more using radio frequency heating in a reducing gas atmosphere.

After lowering the temperature of the susceptor gradually to 600° C., reaction gases for growing ZnO, i.e., diethylzinc (DEZ) and oxygen, are supplied into the reaction vessel, and a 500 Å thick buffer layer 2 of (0001)ZnO single crystal film is epitaxially formed on a sapphire substrate 1. The temperature of the susceptor for forming the epitaxial ZnO buffer layer is preferably in a range of 300° C.–700° C., and is not limited to 600° C. At temperatures below 300° C., a favorable ZnO single crystal film is not epitaxially formed. On the contrary, at a temperature of 700° C. or higher, the film is not adequate as a buffer layer because of poor surface smoothness.

The film thickness of a ZnO buffer layer 2 is preferably in a range of 100 Å–5000 Å. In cases where the film thickness is below 100Å, it will not sufficiently work as a buffer layer to relieve strain due to the lattice mismatch between the sapphire substrate and InGaAlN. In cases where the thickness is above 5000 Å, the surface smoothness and the crystallinity of the InGaAlN crystal which is formed on the buffer layer tends to be damaged in accordance with the damage of the surface smoothness of ZnO buffer layer.

Next, reaction gases for InGaAlN crystal growth are supplied into the reaction vessel after the growth of a ZnO buffer layer 2. However, when a ZnO buffer layer is exposed to a reducing agent such as $NH_3$, which is a source of nitrogen, at a temperature around 1000° C., the temperature required for the epitaxial growth of an InGaAlN cladding and active layer, oxygen is desorbed from the surface of ZnO and the atomic arrangement at the ZnO surface becomes deteriorated. This leads to decrease in the crystalline quality of the InGaAlN formed on the buffer layer.

To avoid this phenomena, firstly, about 200 Å of an InGaAlN buffer layer 3 is grown on the surface of the ZnO buffer layer keeping the temperature of the susceptor at about 600° C. or after lowering the susceptor temperature to about 400° C. The thickness of an InGaAlN buffer layer formed at such low temperatures is preferably 50–2000 Å.

If the thickness of the is less than 50 Å, it does not work sufficiently as a buffer layer. On the contrary, if the thickness is more than 2000 Å, the crystallinity of the InGaAlN epitaxial layer formed afterwards at high temperature tends to be damaged due to decrease in the buffer layer surface smoothness.

Thereafter, the susceptor is heated to around 1000° C., a cladding layer 4 of an n-type InGaAlN doped with Si with a film thickness of 5 µm, an active layer 5 of an undoped InGaAlN with a film thickness of 0.5 µm, and a cladding layer 6 of a p-type InGaAlN doped with Mg with a film thickness of 2 µm are subsequently grown epitaxially. Organometallics such as trimethylindium (TMI), trimethylgallium (TMG), trimethylaluminum (TMA), etc. and $NH_3$ as a nitrogen source can be used as source reaction gases for group III nitride crystal growth. However, the same effect can be obtained using halide compounds, other metals, and other nitrogen compounds such as $N_2H_2$ or organic amines.

$H_2$ or $N_2$ can be used as a carrier gas or bubbling gas. However it is possible to use inert gases such as He or Ar in place of $H_2$ and $N_2$. Also, the dopant materials are not limited to Si and Mg.

In the above first embodiment, crystal growth was explained referring to the MOCVD method, however, it is also possible to obtain InGaAlN having high crystallinity by the introduction of a ZnO buffer layer using other crystal growth methods such as molecular beam epitaxy (MBE method), etc. It is allowable to use different crystal growth methods or instruments for the growth of a ZnO buffer layer from that used for the growth of InGaAlN.

(Embodiment 2)

Figure 3:
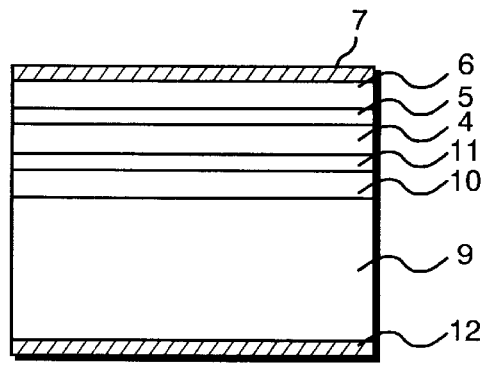
FIG. 3 shows a cross-sectional view of a double heterostructure semiconductor light emitting device according to the second embodiment of the present invention.

FIG. 3 shows a cross section of a light emitting device according to the second embodiment of the present invention. The light emitting device comprises an 1000 Å thick Al-doped low resistance ZnO (0001) epitaxial single crystal film as a buffer layer 10 formed on an n-type low resistance Si (111) substrate 9, a 200 Å thick Si-doped $In_{0.24}Ga_{0.55}Al_{0.21}N$ buffer layer 11 grown at a low temperature, a 2 µm thick low resistance Si-doped n-type $In_{0.24}Ga_{0.55}Al_{0.21}N$ cladding layer 4, a 0.5 µm thick undoped $In_{0.2}Ga_{0.78}Al_{0.02}N$ active layer 5, a 2 µm thick Mg-doped p-type $In_{0.24}Ga_{0.55}Al_{0.21}N$ cladding layer 4, an ohmic electrode 7 on the p-type cladding layer, and an ohmic electrode 12 on the rear surface on the n-type Si substrate.

In the device of this embodiment, an InGaAlN buffer layer 3, an n-type cladding layer 4, an active layer 5 and a p-type cladding layer 6 are matched with the ZnO lattice. The photons and carriers are effectively confined in the active layer 5 by selecting the material compositions so that the bandgap energy of the InGaAlN buffer layer 11 and the cladding layers 4 and 6 is 0.3 eV larger than that of the InGaAlN active layer 5.

In this embodiment, the resistance of the ZnO buffer layer 10 and the InGaAlN buffer layer 11 grown at a low temperature are lowered by doping with Al and Si respectively so that an n-electrode 12 can be formed directly to an n-type low resistance Si substrate 9.

For the above reason, the present embodiment can remarkably simplify the manufacturing process of the n-electrode compared with devices using a sapphire substrate. In the latter type, due to the remarkably high insulating ability of the sapphire substrate, the ohmic electrode 13 for the n-type cladding layer 4 has to be formed after removing a part of the p-type InGaAlN cladding layer 6, InGaAlN active layer 5 and n-type InGaAlN cladding layer 4 by selective etching in the same way as shown in the first embodiment. When appropriate voltages are applied to electrodes 7 and 12, the active layer emits light of 440 nm wavelength. A highly efficient light emission with an external quantum efficiency of 2.5% can be obtained, which is comparable with that of devices formed on sapphire substrates.

According to the present invention, it is possible to obtain a remarkably high crystalline quality InGaAlN epitaxial film on a sapphire substrate. In addition, due to the introduction of a ZnO buffer layer that lattice matches with InGaAlN, it becomes possible to improve the crystallinity of InGaAlN epitaxial films formed on large sized sapphire substrates. This is advantageous, since such sapphire substrates can be obtained rather inexpensively as compared with single crystal oxide substrates such as ZnO, MnO, $MgAl_2O_4$, MgO, CaO, etc., whereon lattice matched epitaxial growth is possible, but formation of a large sized bulk single crystal is difficult. Thus, the present invention provides an highly economical InGaAlN light emitting semiconductor device having a high emission efficiency and a long device lifetime.

Furthermore, since high crystalline quality single crystal ZnO films which can lattice match with InGaAlN can be formed on an Si substrate, it is possible to obtain an InGaAlN epitaxial film with high crystalline quality even when Si is used as the substrate. Thus, the present invention can provide an highly economical InGaAlN light emitting semiconductor device having high emission efficiency and long device lifetime.

What is claimed is:

1. A light emitting semiconductor device comprising a sapphire substrate having a ZnO buffer layer formed on a surface of said sapphire substrate, and a layer of $In_xGa_yAl_{1-x-y}N$ (where, $0 \leq x \leq 1$, $0 \leq x+y \leq 1$) formed on said ZnO buffer layer.

2. The light emitting semiconductor device according to claim 1 wherein said ZnO buffer layer is epitaxially formed on a (0001) surface of said sapphire substrate.

3. The light emitting semiconductor device according to claim 1, wherein an $In_xGa_yAl_{1-x-y}N$ (where, $0 \leq x \leq 1$, $0 \leq x+y \leq 1$) epitaxial buffer layer grown at a temperature less than or equal to 1000° C. is formed directly on said ZnO buffer layer.

4. The light emitting semiconductor device according to claim 1, wherein an $In_xGa_yAl_{1-x-y}N$ (where, $0 \leq x \leq 1$, $0 \leq x+y \leq 1$) epitaxial buffer layer is formed directly on said ZnO buffer layer, said $In_xGa_yAl_{1-x-y}N$ epitaxial buffer layer having a thickness of 5 to 200 nm.

5. The light emitting semiconductor device according to claim 1, wherein an $In_xGa_yAl_{1-x-y}N$ (where, $0 \leq x \leq 1$, $0 \leq x+y \leq 1$) epitaxial buffer layer is formed directly on said ZnO buffer layer, said ZnO buffer layer having a thickness of 10 to 500 nm.

6. A light emitting semiconductor device comprising a Si substrate having a (0001) ZnO buffer layer formed on a (111) surface of said Si substrate, and a layer of $In_xGa_yAl_{1-x-y}N$ (where, $0 \leq x \leq 1$, $0 \leq x+y \leq 1$) formed on said ZnO buffer layer, wherein said ZnO buffer layer is in lattice match with said $In_xGa_yAl_{1-x-y}N$ layer.

7. The light emitting semiconductor device according to claim 6, wherein an $In_xGa_yAl_{1-x-y}N$ (where, $0 \leq x \leq 1$, $0 \leq x+y \leq 1$) epitaxial buffer layer grown at a temperature less than or equal to 1000° C. is formed directly on said ZnO buffer layer.

8. The light emitting semiconductor device according to claim 6, wherein an $In_xGa_yAl_{1-x-y}N$ (where, $0 \leq x \leq 1$, $0 \leq x+y \leq 1$) epitaxial buffer layer is formed directly on said ZnO buffer layer, said $In_xGa_yAl_{1-x-y}N$ epitaxial buffer layer having a thickness of 5 to 200 nm.

9. The light emitting semiconductor device according to claim 6, wherein an $In_xGa_yAl_{1-x-y}N$ (where, $0 \leq x \leq 1$, $0 \leq x+y < 1$) epitaxial buffer layer is formed directly on said ZnO buffer layer, said ZnO buffer layer having a thickness of 10 to 500 nm.

* * * * *

UNITED STATES PATENT AND TRADEMARK OFFICE
CERTIFICATE OF CORRECTION

PATENT NO. : 5,815,520
DATED : September 29, 1998
INVENTOR(S) : Yuji Furushuma

It is certified that error appears in the above-identified patent and that said Letters Patent is hereby corrected as shown below:

Claim 9, Col. 7, line 2, "$In_xGa_yAl_{1-x-y}N$" should be - -$In_xGa_yAl_{1-x-y}N$- -.

Claim 9, Col. 7, line 3, "$0 \leq x+y < 1$)" should be - -$0 \leq x+y \leq 1$)- -

Signed and Sealed this

Twenty-eighth Day of September, 1999

Attest:

Q. TODD DICKINSON

*Attesting Officer*   *Acting Commissioner of Patents and Trademarks*